(12) United States Patent
Nguyen

(10) Patent No.: US 7,151,442 B1
(45) Date of Patent: Dec. 19, 2006

(54) SYSTEM, APPARATUS, AND METHOD FOR TESTING IDENTIFICATION TAGS

(75) Inventor: Thanh H. Nguyen, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 211 days.

(21) Appl. No.: 10/860,513

(22) Filed: Jun. 3, 2004

(51) Int. Cl.
*B60R 25/10* (2006.01)

(52) U.S. Cl. .................. 340/428; 340/572.1; 340/505; 340/515; 702/182; 29/593; 324/501; 324/763

(58) Field of Classification Search ................ 340/428, 340/572.1, 505, 515; 702/182; 29/593; 324/501, 514, 763, 765
See application file for complete search history.

(56) References Cited

U.S. PATENT DOCUMENTS

| | | | | | |
|---|---|---|---|---|---|
| 6,104,291 | A | * | 8/2000 | Beauvillier et al. | 340/572.1 |
| 6,161,205 | A | * | 12/2000 | Tuttle | 714/724 |
| 6,236,223 | B1 | * | 5/2001 | Brady et al. | 324/765 |
| 6,259,353 | B1 | * | 7/2001 | Berger et al. | 340/10.1 |
| 6,369,694 | B1 | * | 4/2002 | Mejia | 340/10.1 |
| 2005/0223286 | A1 | * | 10/2005 | Forster | 714/25 |

* cited by examiner

*Primary Examiner*—Jeffery Hofsass
*Assistant Examiner*—Samuel J. Walk

(57) ABSTRACT

An apparatus includes at least one tag holder capable of receiving and holding a plurality of tags. The apparatus also includes at least one antenna capable of receiving wireless signals from the plurality of tags during a test of the tags. The apparatus may further include at least one of a temperature controller capable of controlling a temperature experienced by the tags during the test and a humidity controller capable of controlling a humidity experienced by the tags during the test. The at least one tag holder may include a plurality of guides capable of receiving and holding the tags, a plurality of rods capable of supporting the guides, and a plurality of spacers capable of maintaining a distance between adjacent guides.

21 Claims, 3 Drawing Sheets

SYSTEM, APPARATUS, AND METHOD FOR TESTING IDENTIFICATION TAGS

TECHNICAL FIELD

This disclosure is generally directed to testing systems and more specifically to a system, apparatus, and method for testing identification tags.

BACKGROUND

Radio frequency identification ("RFID") tags and other tags are becoming more and more popular as a mechanism for providing security in different environments. For example, employees or other personnel may wear badges containing RFID tags. The RFID tags may be used to track the locations of the personnel and to limit access to different portions of a facility. As another example, RFID tags may be attached to computers and other valuable equipment. These RFID tags may be used to track the locations of the equipment and to prevent the equipment from being taken from particular locations.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
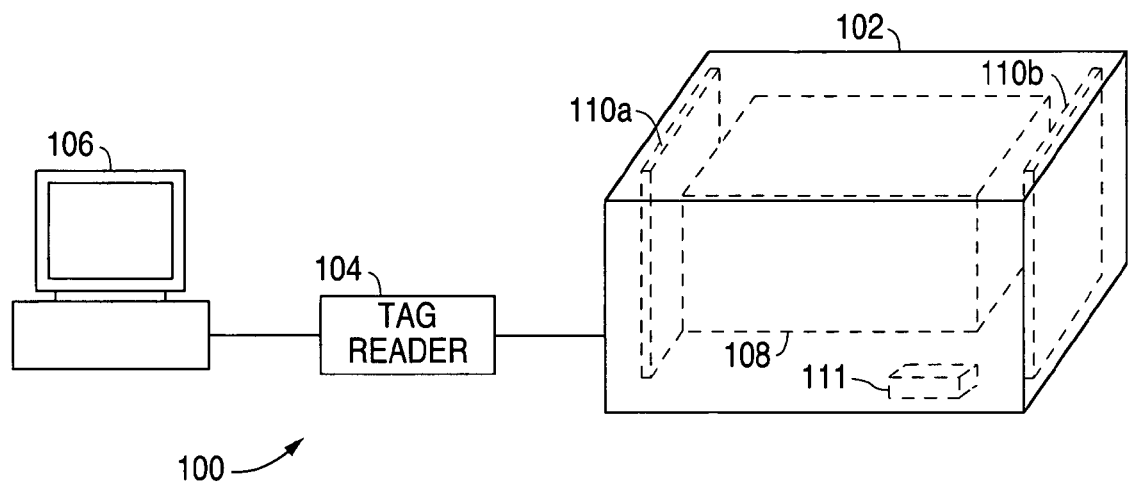
FIG. 1 illustrates an example system for testing identification tags according to one embodiment of this disclosure.

FIG. 1 illustrates an example system 100 for testing identification tags according to one embodiment of this disclosure. In this example, the system 100 includes a test chamber 102, a tag reader 104, and a test computer 106. The system 100 shown in FIG. 1 is for illustration only. Other embodiments of the system 100 may be used without departing from the scope of this disclosure.

The test chamber 102 is coupled to the tag reader 104. The test chamber 102 is capable of receiving one or more radio frequency identification ("RFID") or other tags. The test chamber 102 is also capable of supporting one or more tests of the tags. For example, the test chamber 102 may subject the tags to one or more temperatures and/or humidities. In addition, the test chamber 102 allows the tags to communicate with the tag reader 104 during a test. In this document, the term "couple" and its derivatives refer to any direct or indirect communication between two or more elements, whether or not the elements are in physical contact with one another. Also, the term "tag" refers to a portable device that may be affixed to a moveable item, such as a person, inventory, or vehicle.

The test chamber 102 may be used to support any suitable test or tests of the tags. For example, the test chamber 102 may support operational life testing of the tags and temperature-humidity-bias testing of the tags. Operational life testing typically involves subjecting the tags to an elevated temperature. Temperature-humidity-bias testing typically involves subjecting the tags to an elevated temperature and an elevated humidity. These tests allow a manufacturer to estimate the operational life of the tags and to determine if the tags meet the specified behavior of the tags. The test chamber 102 represents any suitable structure capable of receiving multiple tags.

The test chamber 102 may provide any suitable temperatures and/or humidities during the test or tests. Also, the test chamber 102 may be designed specifically for a single type of test or for multiple tests. In particular embodiments, the test chamber 102 is capable of heating the tags to a temperature of approximately 125–150° centigrade during operational life testing. In other particular embodiments, the test chamber 102 is capable of heating the tags to a temperature of approximately 85° centigrade at a humidity of approximately 85 percent during temperature-humidity-bias testing.

The tag reader 104 is coupled to the test chamber 102 and the test computer 106. The tag reader 104 is capable of communicating signals, such as interrogation signals, to the tags in the test chamber 102. The tag reader 104 is also capable of receiving responses from the tags in the test chamber 102. The contents of the signals communicated to the tags may be received from the test computer 106, and the contents of the received signals may be provided to the test computer 106. The tag reader 104 includes any hardware, software, firmware, or combination thereof for communicating signals to and/or receiving signals from multiple RFID or other tags.

The test computer 106 is coupled to the tag reader 104. The test computer 106 supports the testing of the tags in the test chamber 102. For example, the test computer 106 may repeatedly cause the tag reader 104 to interrogate each tag in the test chamber 102 during a test. The test computer 106 determines whether each of the tags responds when interrogated. If not, the test computer 106 identifies the length of time it took for a tag to fail during a test. The test computer 106 could also analyze the results from the test or tests, such as by estimating the operational life of the tags and determining if the tags meet the tags' specifications. In particular embodiments, the test computer 106 could further be coupled to the test chamber 102 and control the temperature and/or humidity inside the test chamber 102. The test computer 106 includes any hardware, software, firmware, or combination thereof for controlling the testing of the tags. In the illustrated example, the test computer 106 represents a desktop computer.

Figure 2:
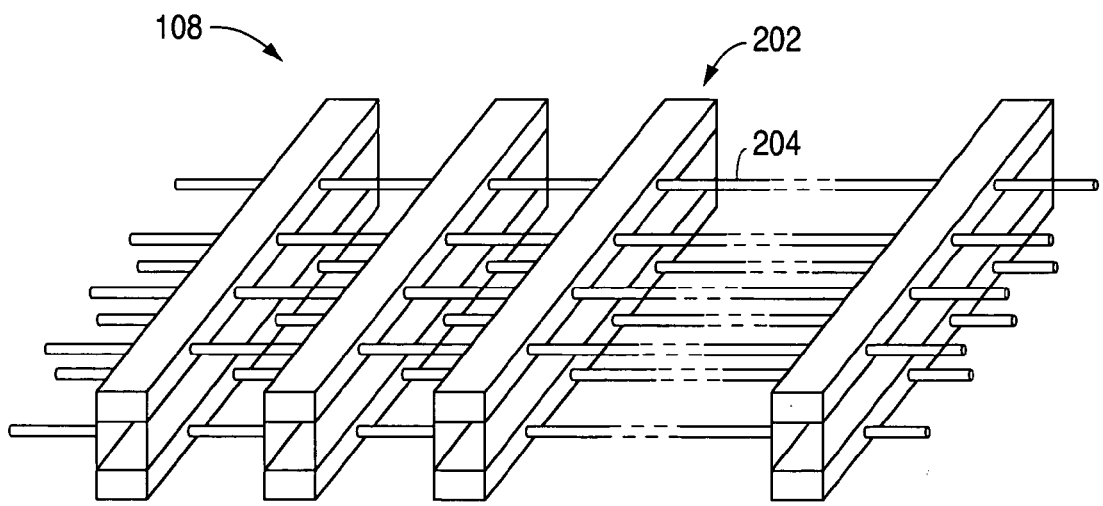
FIG. 2 illustrates an example tag holder in a test chamber according to one embodiment of this disclosure.
Figure 3:
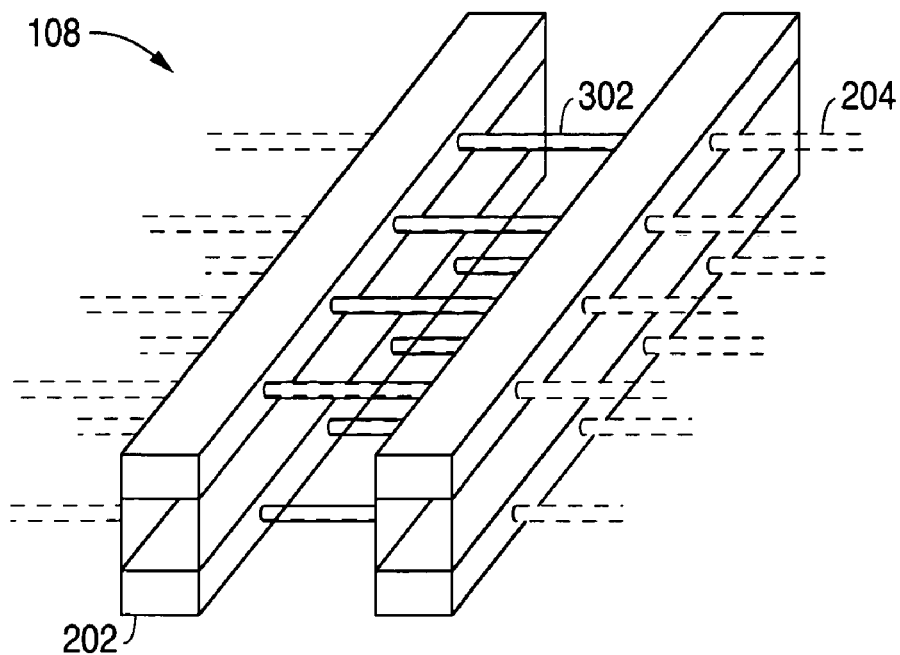
FIG. 3 illustrates additional details of an example tag holder in a test chamber according to one embodiment of this disclosure.

In the illustrated embodiment, the test chamber 102 includes one or more tag holders 108, one or more antennas 110a–110b, and one or more heating/humidity controllers 111. Each tag holder 108 is capable of receiving multiple tags and holding the tags in position for testing. For example, each tag holder 108 may include guides, where each guide is capable of receiving and holding one row of tags. Each tag holder 108 may be permanently fixed in the test chamber 102 or be removable. Also, each tag holder 108 may be accessed by a door, access panel, or other mechanism on one or more sides of the test chamber 102. Each tag holder 108 includes any suitable structure for receiving and holding multiple tags. Details of an example tag holder 108 are shown in FIGS. 2 and 3, which are described below.

Each of the antennas 110a–110b is coupled to the tag reader 104. The antennas 110a–110b facilitate communication of signals to and/or reception of signals from the tags in the test chamber 102. For example, the antennas 110a–110b may receive signals from the tag reader 104 and communicate the signals to the tags in the test chamber 102. The antennas 110a–110b may also receive signals from the tags and communicate the signals to the tag reader 104. Each of the antennas 110a–110b includes any suitable structure for communicating and/or receiving wireless signals. In this example, the antennas 110a–110b are mounted in parallel on opposing sides of the test chamber 102. The antennas 110a–110b could be mounted in any other suitable position or positions. Also, the antennas 110a–110b may be coupled to the tag reader 104 in any suitable manner, such as using one or more coaxial cables or other connections.

In particular embodiments, the antennas 110a–110b are formed from a metallic material or materials such as copper, and the antennas 110a–110b represent the only metallic material inside the test chamber 102. The tag holders 108 may be formed from one or more non-metallic materials. For example, the tag holders 108 could include components formed from fiberglass, teflon, or any other non-metallic material or materials.

The heating/humidity controllers 111 are capable of controlling the temperature and/or humidity in the test chamber 102. For example, the heating/humidity controllers 111 may be capable of increasing the temperature in the test chamber 102 to a temperature of approximately 125–150° centigrade during operational life testing. The heating/humidity controllers 111 may also be capable of increasing the temperature in the test chamber 102 to a temperature of approximately 85° centigrade and establishing a humidity of approximately 85 percent during temperature-humidity-bias testing. The heating/humidity controllers 111 represent any suitable structure or structures for controlling the temperature and/or humidity in the test chamber 102. As an example, the heating/humidity controllers 111 may include one or more heating elements and one or more humidifiers. Also, the heating/humidity controllers 111 may include one or more measuring elements for measuring temperature and/or humidity, such as a thermometer and a hygrometer.

The test chamber 102 may be used to test any suitable number of tags. For example, the test chamber 102 could include three tag holders 108, where each holder 108 is capable of holding fifteen rows of seven tags. In this example, the test chamber 102 holds three hundred and fifteen tags. As another example, the test chamber 102 could include one tag holder capable of holding eleven rows of seven tags. In this example, the test chamber 102 holds seventy seven tags.

The test chamber 102 may also have any suitable dimensions. For example, the test chamber 102 could be twenty inches in width, eighteen inches in depth, and twelve inches in height (internally within the chamber). As another example, the test chamber 102 could be twenty inches in width, fourteen inches in depth, and twelve inches in height (internally within the chamber).

Although FIG. 1 illustrates one example of a system 100 for testing identification tags, various changes may be made to FIG. 1. For example, while FIG. 1 illustrates the use of two antennas 110a–110b in the test chamber 102, the test chamber 102 may include a single antenna or more than two antennas. Also, while FIG. 1 illustrates the use of a desktop computer as the test computer 106, the test computer 106 could represent any other computing device, such as a laptop computer or personal digital assistant. Further, any suitable number of test chambers 102, tag readers 104, and test computers 106 may be used in the system 100. Beyond that, the tag reader 104 could form part of the test chamber 102 or part of the test computer 106. In addition, the tags being tested have been described as being two-way devices capable of receiving signals and responding with other signals. The tags being tested could also represent one-way devices, such as devices that transmit signals but are not capable of receiving signals.

FIG. 2 illustrates an example tag holder 108 in a test chamber 102 according to one embodiment of this disclosure. The tag holder 108 may be used in the test chamber 102 of FIG. 1 to hold any suitable number of RFID or other tags. The tag holder 108 shown in FIG. 2 is for illustration only. Other embodiments of the tag holder 108 may be used without departing from the scope of this disclosure.

As shown in FIG. 2, the tag holder 108 includes multiple guides 202. The guides 202 are used to receive and support multiple RFID tags or other types of tags being tested. For example, the guides 202 may be used to support one or more tags in the upright position, although other suitable positions may be used. The guides 202 represent any suitable structures for supporting tags. In particular embodiments, the guides 202 are formed from one or more non-metallic materials, such as teflon.

The tag holder 108 also includes one or more rods 204. The rods 204 are used to hold the guides 202 in place. In this example, four rods 204 run through the top portion of the guides 202, and four rods 204 run through the bottom portion of the guides 202. However, any suitable number of rods 204 may be used in the tag holder 108. The rods 204 represent any suitable structures for supporting the guides 202. In particular embodiments, the rods 204 are formed from one or more non-metallic materials, such as fiberglass.

Any suitable number of guides 202 may be used in the tag holder 108, and each guide 202 may be capable of receiving any suitable number of tags. In some embodiments, the tag holder 108 includes eleven guides 202. In particular embodiments, the tag holder 108 includes eleven guides 202, and each guide 202 is capable of receiving seven tags (seventy seven tags total). In other embodiments, the tag holder 108 includes fifteen guides 202. In particular embodiments, each tag holder 108 includes fifteen guides 202, and each guide 202 is capable of receiving seven tags (one hundred and five tags total). Other embodiments including different numbers of guides 202, rods 204, and/or tags may also be used.

The guides 202 may have any suitable dimensions. Also, the guides 202 may be spaced in any suitable manner. For example, in some embodiments, each guide 202 is spaced one inch (center-to-center distance) from each adjacent guide 202. In particular examples, fifteen guides 202 are used in the tag holder 108. In these particular embodiments, the guides 202 at each end of the tag holder 108 are sixteen inches (center-to-center distance) apart.

In addition, multiple tag holders 108 could be used in the test chamber 102. For example, three tag holders 108 could be stacked in the test chamber 102. If each tag holder 108 is capable of holding one hundred and five tags, the test chamber 102 would contain three hundred and fifteen tags. The stacked tag holders 108 could have any suitable collective dimensions. For example, the stacked tag holders 108 could have a width of 19.25 inches, a depth of sixteen inches, and a height of 11.25 inches.

Although FIG. 2 illustrates one example of a tag holder 108 in a test chamber 102, various changes may be made to FIG. 2. For example, the tag holder 108 may include any number of guides 202 and rods 204. Also, each guide 202 in the tag holder 108 may hold any suitable number of tags.

FIG. 3 illustrates additional details of an example tag holder 108 in a test chamber 102 according to one embodiment of this disclosure. The tag holder 108 shown in FIG. 3 is for illustration only. Other embodiments of the tag holder 108 may be used without departing from the scope of this disclosure.

As shown in FIG. 3, the tag holder 108 includes the guides 202 and the rods 204. In this example, the tag holder 108 also includes multiple spacers 302. The spacers 302 are used to separate the guides 202. In particular, the spacers 302 are used to maintain a specific distance between the guides 202. This allows the tags placed in the guides 202 to remain separated.

The spacers 302 may be formed from any suitable material or materials. In some embodiments, the spacers 302 are formed from a non-metallic material or materials. As a particular example, the spacers 302 may be formed from fiberglass. Also, in this example, the spacers 302 are tubular and fit around the rods 204. The spacers 302 could have any other suitable shape or operate in any other suitable manner to maintain a distance between the guides 202.

Although FIG. 3 illustrates additional details of an example tag holder 108 in a test chamber 102, various changes may be made to FIG. 3. For example, the number of spacers 302 shown in FIG. 3 is for illustration only. The tag holder 108 could include any suitable number of spacers 302. Also, in some embodiments, the spacers 302 need not be used in the tag holder 108. As an example, the spacers 302 may not be needed when the guides 202 are fixed to the rods 204 and cannot change positions on the rods 204.

Figure 4:
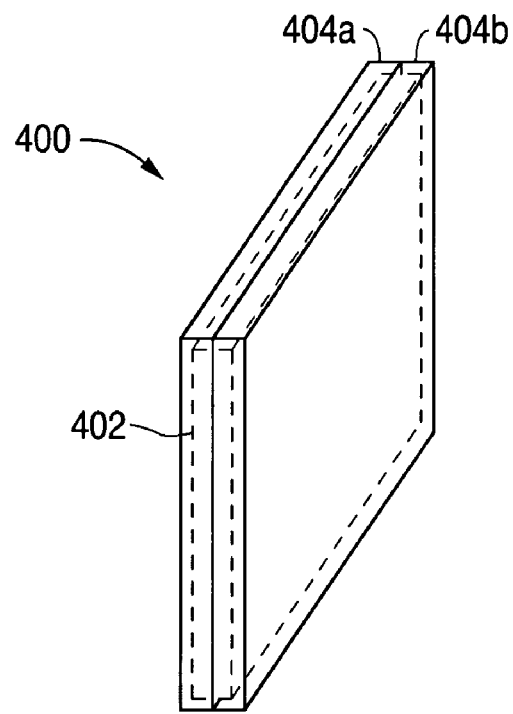
FIG. 4 illustrates an example identification tag arrangement according to one embodiment of this disclosure.

FIG. 4 illustrates an example identification tag arrangement 400 according to one embodiment of this disclosure. In this example, the tag arrangement 400 includes a tag 402 and two encapsulations 404a–404b. The tag arrangement 400 shown in FIG. 4 is for illustration only. Other embodiments of the tag arrangement 400 may be used without departing from the scope of this disclosure.

The tag 402 represents a tag to be tested in the test chamber 102 of FIG. 1. The tag 402 may include, for example, transmission and reception circuitry for transmitting and receiving radio frequency or other signals. The tag 402 may also include a controller for determining whether a response to an incoming signal should be sent and for generating the response if needed. The tag 402 may include any other or additional circuitry or other logic. The tag 402 may have any suitable size and shape. In particular embodiments, the tag 402 measures three inches in depth by 2.375 inches in height.

The encapsulations 404a–404b encase the tag 402 for placement in the guides 202 of the test chamber 102. For example, the encapsulations 404a–404b may alter the shape of the tag 402 so that the guides 20 may hold the tag 402 in a particular position. The encapsulations 404a–404b represent any suitable material or materials for encasing the tag 402. For example, the encapsulations 404a–404b may be formed from one or more non-metallic materials, such as fiberglass. Also, the encapsulations 404a–404b may have any suitable size and shape. As a particular example, the encapsulations 404a–404b may be 0.030 inches thick, and the entire tag arrangement 400 may be 0.5 inches less wide that the guides 202 (0.25 inches on each side of the tag arrangement 400).

Although FIG. 4 illustrates one example of a tag arrangement 400, various changes may be made to FIG. 4. For example, the tag 402 could be used in the test chamber 102 without any encapsulations 404a–404b. Also, the tag 402 and encapsulations 404a–404b could have any suitable sizes, shapes, and arrangements. In addition, the tag arrangement 400 could include any number of encapsulations 404a–404b.

Figure 5:
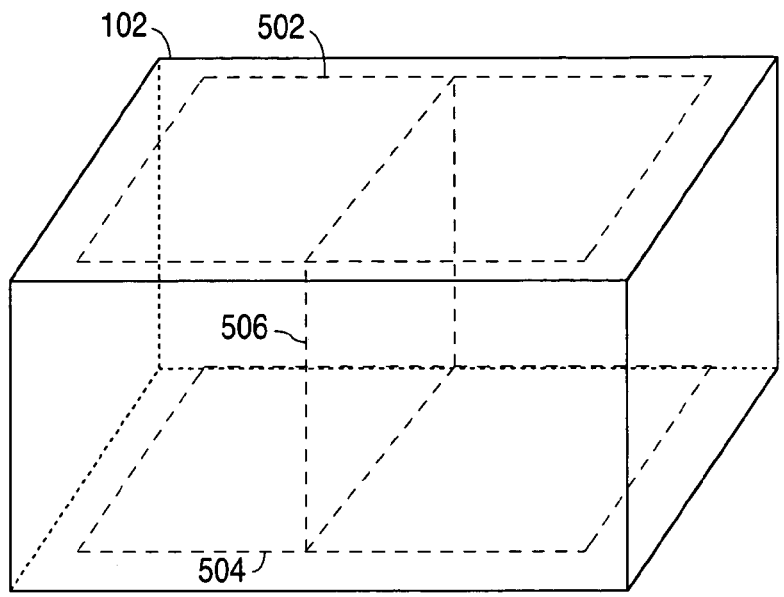
FIG. 5 illustrates additional details of an example test chamber according to one embodiment of this disclosure.

FIG. 5 illustrates additional details of an example test chamber 102 according to one embodiment of this disclosure. The test chamber 102 shown in FIG. 5 is for illustration only. Other embodiments of the test chamber 102 may be used without departing from the scope of this disclosure.

In this example, the test chamber 102 includes three retainer plates 502–506. The retainer plates 502–506 are used to add support to the test chamber 102. The retainer plates 502–506 are also used to reduce or prevent flexing or twisting of the test chamber 102. This may help to reduce or prevent damage to the test chamber 102.

In the illustrated embodiment, one retainer plate 502 is located along the top of the test chamber 102, and another retainer plate 504 is located along the bottom of the test chamber 102. The third retainer plate 506 runs parallel with the side walls of the test chamber 102 and between the first two retainer plates 502–504. The number and arrangement of the retainer plates 502–506 are for illustration only. The test chamber 102 may include any suitable number of retainer plates, and the retainer plates may be arranged in any suitable manner.

The retainer plates 502–506 may be formed from any suitable material or materials. For example, the retainer plates 502–506 may be formed from one or more non-metallic materials. In particular embodiments, the retainer plates 502–506 are formed from fiberglass. Also, the retainer plates 502–506 may have any suitable shape. As an example, the retainer plates 502–506 could be square or rectangular with openings in the middle of the retainer plates 502–506.

Although FIG. 5 illustrates additional details of one example of a test chamber 102, various changes may be made to FIG. 5. For example, the test chamber 102 need not include any retainer plates.

Figure 6:
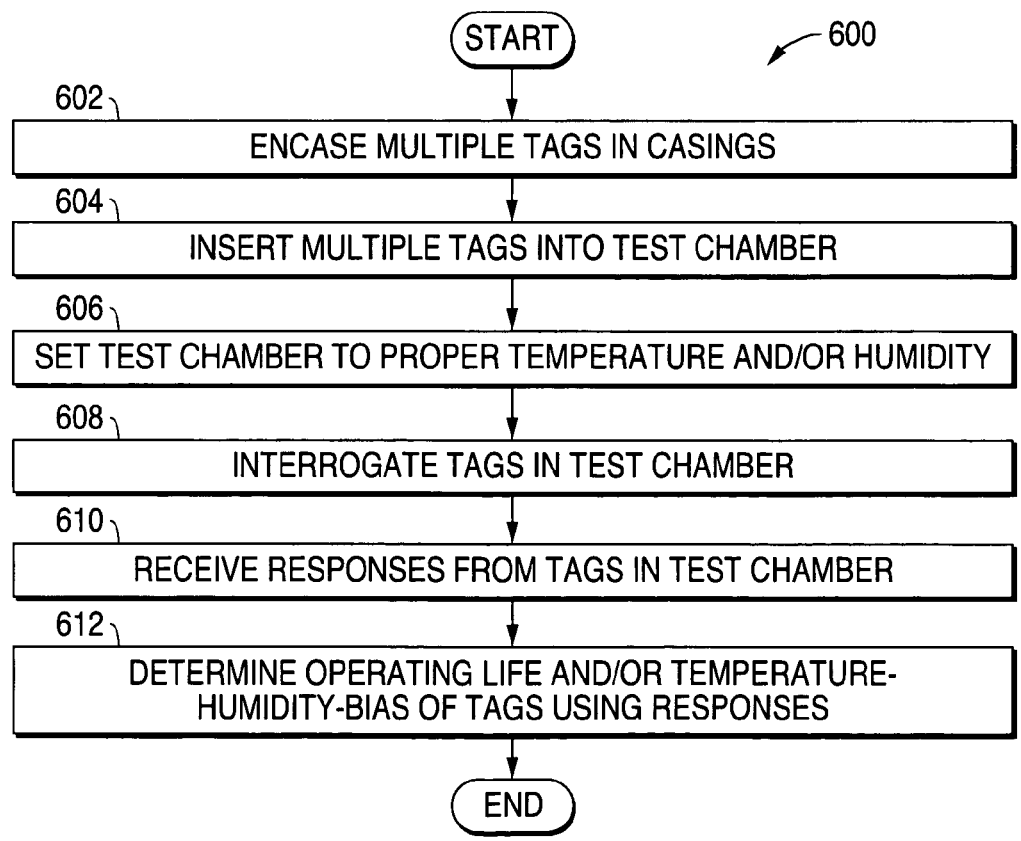
FIG. 6 illustrates an example method for testing identification tags according to one embodiment of this disclosure.

FIG. 6 illustrates an example method 600 for testing identification tags according to one embodiment of this disclosure. For ease of explanation, the method 600 is described with respect to the system 100 of FIG. 1. The method 600 could be used in any other device or system.

Multiple tags are encased in one or more casings at step 602. This may include, for example, encapsulating a tag 402 in one or more encapsulations 404a–404b. The encapsulations 404a–404b may have any suitable shape. As a particular example, the encapsulations 404a–404b may be shaped so that the encased tag 402 is capable of being inserted into the guides 202 of the test chamber 102.

The tags are inserted into the test chamber 102 at step 604. This may include, for example, inserting the encased tags 402 into the guides 202 of a tag holder 108. This may also include placing the tag holder 108 in the test chamber 102. As particular examples, this may include inserting seventy seven tags 402 into the test chamber 102 (eleven rows of seven tags 402). This may also include inserting three hundred and fifteen tags 402 into the test chamber 102 (three tag holders 108 of fifteen rows of tags 402 each at seven tags 402 per row).

The test chamber 102 is set to the appropriate temperature and/or humidity at step 606. This may include, for example, setting the test chamber 102 to a temperature of approximately 125–150° centigrade during operational life testing or to a temperature of approximately 85° centigrade at a humidity of approximately 85 percent during temperature-humidity-bias testing.

The tags in the test chamber 102 are interrogated at step 608. This may include, for example, the test computer 106 causing the tag reader 104 to communicate interrogation signals to the tags 402 through the antennas 110a–110b. The tags 402 may be interrogated periodically or repeatedly during the test being performed. Also, the tags 402 may be interrogated any suitable number of times and at any suitable interval.

Responses from the tags in the test chamber 102 are received at step 610. This may include, for example, the antennas 110a–10b receiving any interrogation responses from the tags 402 and passing the responses to the tag reader 104. This may also include the tag reader 104 passing the responses to the test computer 106. At various points during the test, one or more of the tags 402 may fail and stop responding. It is also possible that all of the tags 402 may fail during a test, at which point no responses from the tags 402 will be received.

The results of the operating life testing, temperature-humidity-bias testing, or other testing are determined at step 612. This may include, for example, the test computer 106 analyzing the results from the test and determining the operating life of the tags 402. This may also include the test computer 106 analyzing the results from the test and determining the results for the temperature-humidity-bias test. This may further include the test computer 106 making data collected during the test available to another device or system or to a person for analysis.

Although FIG. 6 illustrates one example of a method 600 for testing identification tags, various changes may be made to FIG. 6. For example, the tags 402 need not be encased at step 602. Also, steps 608–610 may be repeated any suitable number of times and at any suitable interval or intervals of time. In addition, if the tags are capable of transmitting signals only (not capable of bi-directional communication), the step 608 of interrogating the tags may be omitted.

It may be advantageous to set forth definitions of certain words and phrases that have been used within this patent document. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, software, firmware, or combination thereof. It should be noted that the functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus, comprising:
   at least one tag holder capable of receiving and holding a plurality of tags, wherein each of the at least one tag holder comprises:
   a plurality of guides capable of receiving and holding the tags;
   a plurality of rods capable of supporting the guides; and
   a plurality of spacers, wherein each spacer separates two adjacent guides supported by the rod running through that spacer and those two adjacent guides; and
   at least one antenna capable of receiving wireless signals from the plurality of tags during a test of the tags.

2. The apparatus of claim 1, further comprising at least one of:
   a temperature controller capable of controlling a temperature experienced by the tags during the test; and
   a humidity controller capable of controlling a humidity experienced by the tags during the test.

3. The apparatus of claim 2, wherein:
   the temperature controller comprises a heater; and
   the humidity controller comprises a humidifier.

4. The apparatus of claim 1, wherein:
   the at least one antenna comprises one or more metallic materials; and
   the guides, rods, and spacers comprise one or more non-metallic materials.

5. The apparatus of claim 4, wherein the guides, rods, and spacers comprise fiberglass.

6. The apparatus of claim 1, wherein each of the tags is encased in one or more encapsulations.

7. The apparatus of claim 1, wherein the at least one tag holder comprises one of:
   a single tag holder capable of holding seventy seven tags; and
   three tag holders each capable of holding one hundred five tags.

8. The apparatus of claim 1, wherein the at least one antenna is further capable of communicating interrogation signals to the tags, wherein the tags are capable of responding to the interrogation signals with the wireless signals.

9. The apparatus of claim 1, wherein the tags comprise radio frequency identification tags.

10. The apparatus of claim 1, wherein the at least one tag holder comprises a plurality of tag holders capable of being stacked on top of each other in the apparatus.

11. A system, comprising:
    a test chamber comprising:
      at least one tag holder capable of receiving and holding a plurality of tags, wherein each of the at least one tag holder comprises:
      a plurality of guides capable of receiving and holding the tags;
      a plurality of rods capable of supporting the guides; and
      a plurality of spacers, wherein each spacer separates two adjacent guides supported by the rod running through that spacer and those two adjacent guides; and
      at least one antenna capable of receiving wireless signals from the plurality of tags during a test of the tags; and
    a tag reader capable of providing at least a portion of contents of the wireless signals received by the antenna.

12. The system of claim 11, further comprising a test computer capable of receiving the at least a portion of the contents of the wireless signals from the tag reader.

13. The system of claim 12, wherein the test computer is further capable of identifying a length of time into the test that a particular tag fails to communicate a wireless signal.

14. The system of claim 11, wherein the test chamber further comprises at least one of:
- a temperature controller capable of controlling a temperature experienced by the tags during the test; and
- a humidity controller capable of controlling a humidity experienced by the tags during the test.

15. The system of claim 11, wherein:
- the at least one antenna comprises one or more metallic materials; and
- the guides, rods, and spacers comprise one or more non-metallic materials.

16. The apparatus of claim 11, wherein:
- the tag reader is further capable of generating interrogation signals for the tags; and
- the at least one antenna is further capable of communicating the interrogation signals to the tags, wherein the tags are capable of responding to the interrogation signals with the wireless signals.

17. The system of claim 11, wherein the at least one tag holder comprises a plurality of tag holders capable of being stacked on top of each other in the test chamber.

18. A method, comprising:
- placing a plurality of tags in a test chamber using at least one tag holder, wherein each of the at least one tag holder comprises:
  - a plurality of guides capable of receiving and holding the tags;
  - a plurality of rods capable of supporting the guides; and
  - a plurality of spacers, wherein each spacer separates two adjacent guides supported by the rod running through that spacer and those two adjacent guides;
- subjecting the plurality of tags to at least one of an elevated temperature and an elevated humidity; and
- receiving wireless signals from the plurality of tags when the tags are subjected to at least one of the elevated temperature and the elevated humidity.

19. The method of claim 18, further comprising communicating interrogation signals to the tags; and
wherein the tags are capable of responding to the interrogation signals with the wireless signals.

20. The method of claim 18, further comprising identifying a length of time into a test that a particular tag fails to communicate a wireless signal.

21. The method of claim 18, wherein placing the plurality of tags in the test chamber comprises stacking a plurality of tag holders on top of each other in the test chamber, each tag holder capable of receiving and holding multiple ones of the tags.

* * * * *

UNITED STATES PATENT AND TRADEMARK OFFICE
CERTIFICATE OF CORRECTION

PATENT NO. : 7,151,442 B1
APPLICATION NO. : 10/860513
DATED : December 19, 2006
INVENTOR(S) : Thanh H. Nguyen It is certified that error appears in the above-identified patent and that said Letters Patent is hereby corrected as shown below:

Column 7, line 11, delete "110a-10b" and replace with --110a-110b--.

Signed and Sealed this

Fifteenth Day of May, 2007

JON W. DUDAS
*Director of the United States Patent and Trademark Office*